April 17, 1962 J. B. JONES 3,029,766
ULTRASONIC TOOL
Filed May 2, 1956 2 Sheets-Sheet 1

INVENTOR.
JAMES BYRON JONES
BY
Arthur H. Seidel
ATTORNEY

April 17, 1962 J. B. JONES 3,029,766

ULTRASONIC TOOL

Filed May 2, 1956 2 Sheets-Sheet 2

INVENTOR.
JAMES BYRON JONES
BY Arthur H. Seidel
ATTORNEY

United States Patent Office 3,029,766

Patented Apr. 17, 1962

3,029,766

ULTRASONIC TOOL

James Byron Jones, West Chester, Pa., assignor to Aeroprojects, Inc., West Chester, Pa., a corporation of Pennsylvania Filed May 2, 1956, Ser. No. 582,147

12 Claims. (Cl. 113—126)

The present invention relates to an ultrasonic tool having a plurality of flexible vibration-transmitting members, and more particularly to an ultrasonic soldering device.

There are many ultrasonic applications in which it is presently necessary or desirable to employ a plurality of closely positioned transducers and vibration-transmitting members. For example, in the treatment of liquid media such as in the precipitation, agglomeration, emulsification and dispersion of liquid and colloid systems through the action of elastic vibratory energy, a plurality of means for transmitting vibratory energy may be inserted within the systems, as for example, to achieve large workface areas. Existing apparatus has proven to be cumbersome and unwieldly for such purposes.

Furthermore, transducers whether of the magnetostrictive or of the piezoelectric type are relatively expensive to construct. Their construction is frequently complicated by the necessity for the rapid dissipation of heat, space requirements for power conduits, supporting and carrying means, etc. These various problems are magnified when the transducers must, of necessity, be positioned close together. As a result, ultrasonic implements and tools have not been used where it is essential for the elastic vibratory energy to be applied to different work areas which are small and so close together as to render the use of multiple transducers altogether impractical.

Important commercial examples of this have arisen in the soldering of printed circuits, instrument assemblies, electronic sub-assemblies, chassis assemblies, transistor connections, commutator connections, prong base tips, and devices used in automation where precision multipoint fluxless soldering is greatly to be desired. For example, in recent years the use of printed circuit base plates to lower the cost of electronic assemblies has gained widespread adoption. Such printed circuit base plates permit the use of automatic assembly systems involving a conveyor web onto which the printed circuit base plates are fed, in combination with a plurality of component dispensing heads which position and attach various electronic components such as resistors, capacitors, pulse transformers, diodes, etc. to each printed circuit base plate. At the present time the attachment of the components to the base plate is effected by mechanically connecting the leads from the various components to the base plate, as by crimping or offsetting. Mechanical connection of this type is manifestly not as satisfactory for electrical purposes as that which may be effected by soldering. However, due to the close proximity of the various components which are mounted upon a printed circuit base plate and the problems attendant thereto, completely and economically satisfactory automatic assembly systems in which soldering of the components to the base plate is effected have not heretofore been developed. Thus, it has been suggested to dip the entire underside of a printed circuit assembly into molten flux and then into molten solder. This has proved to be most cumbersome and unsatisfactory as the solder must penetrate into tiny crevices, drain freely, and be free from dross films and "tails." As assemblies are repeatedly dipped into the solder, the solder becomes contaminated with flux and surface film preventing it from functioning adequately.

In addition to the situations set forth above, there are many cases in which it is desirable to have a plurality of vibration transmitting members operating in an identical fashion. The driving of multiple ultrasonic units in synchronization is, as a practical matter, most difficult. Thus, substantially no two transducers operate at the identical frequency.

This invention has as an object the provision of an ultrasonic tool in which a single transducer furnishes the energy for a plurality of work areas.

This invention has as another object the provision of an ultrasonic tool having a plurality of flexible vibration-transmitting members which may be separately manipulated into a plurality of desired configurations, and which may be readily rearranged to suit new connection patterns.

This invention has as still another object the provision of an ultrasonic device in which a plurality of vibration transmitting members are driven at the identical frequency.

This invention has as yet another object the provision of a novel ultrasonic soldering device permitting precision multipoint fluxless soldering.

This invention has as a further object the provision of an ultrasonic soldering device having primary utility for the fluxless soldering of electronic assemblies, which delivers the selected amount of solder to a finite work area without overheating adjacent components.

This invention has as a still further object the provision of an automatic assembly mechanism for electronic circuits of the printed circuit type in which the electrical components are connected by soldering to the printed circuit base plate.

For the purpose of illustrating the invention there are shown in the drawings forms which are presently preferred; it being understood, however, that this invention is not limited to the precise arrangements and instrumentalities shown.

Figures 1, 3:
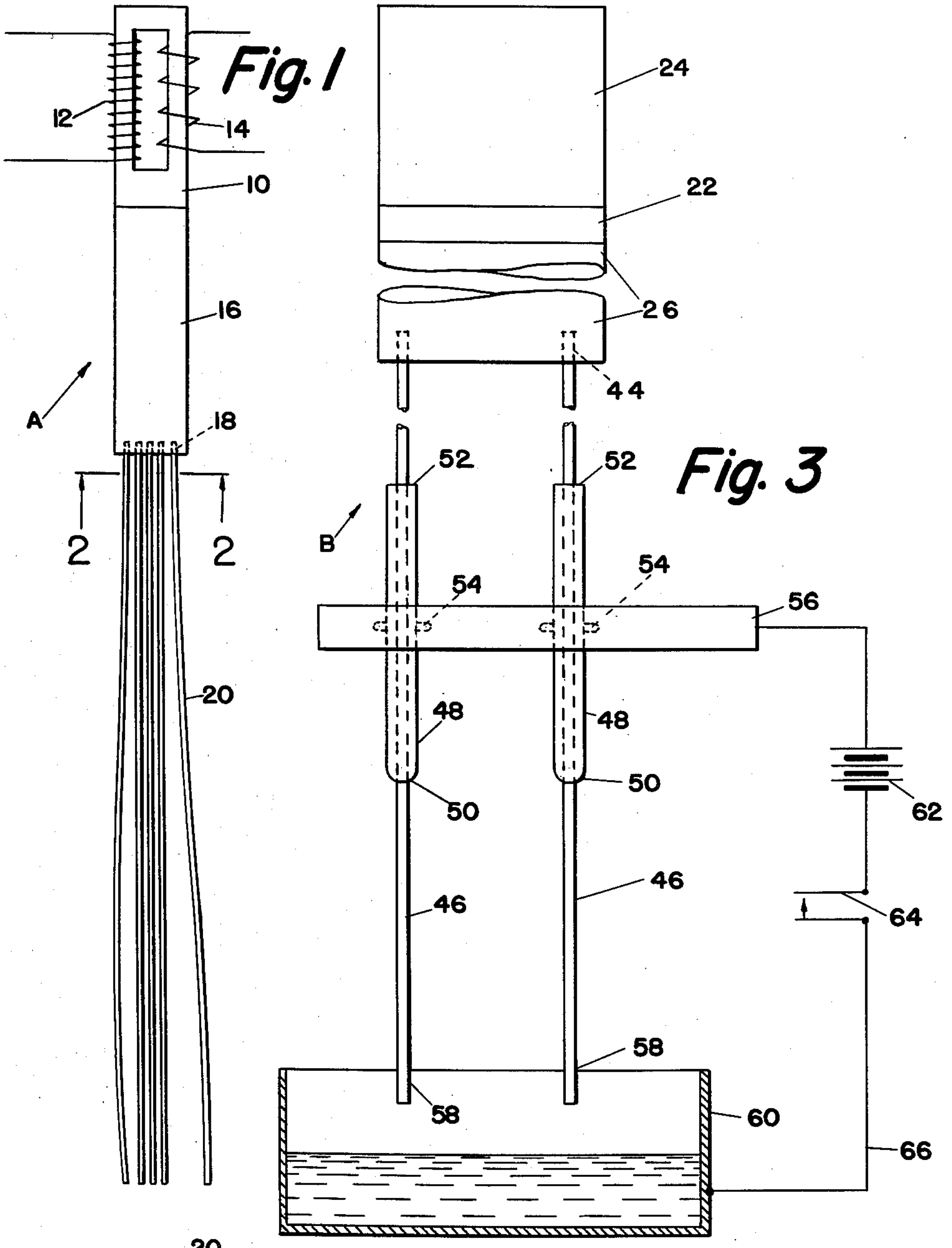
FIGURE 1 is an elevational view of one embodiment of the ultrasonic tool of the present invention.
FIGURE 3 is a diagrammatic view of another embodiment of the ultrasonic tool of the present invention.
Figure 2:
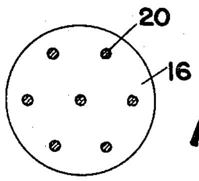
FIGURE 2 is a view along line 2—2 on FIGURE 1.

Referring initially to FIGURES 1 and 2 the embodiment of the present invention shown therein, is an "octopus" type device designated as the tool A, and includes a magnetostrictive transducer 10, which may comprise a nickel stack of known design. In place of nickel, other magnetostrictive metals such as the alloy Permendur (an iron-cobalt alloy), or nickel-iron alloys, or Alfenol (an aluminum-iron alloy), may be utilized. A wide variety of magnetostrictive transducers are known to those skilled in this art and the construction of the transducer need not be described in detail. The nickel stack forming the magnetostrictive transducer 10 is provided with a polarizing coil 12 and an excitation coil 14. It will be understood by those skilled in the art that variation of the magnetic field strength of the excitation coil 14 will produce concomitant variations in the dimensions of the magnetostrictive transducer 10 provided the polarizing coil 12 is charged at a suitable level with direct current, and that the frequency of the aforesaid variations, namely the change in size of the magnetostrictive transducer 10 will be equal to the frequency of the alternating electric current flowing through the excitation coil 14.

While a magnetostrictive transducer 10 is illustrated in this embodiment of the present invention, it is, of course, to be understood that other sources for elastic vibratory energy may be substituted therefor. As will be more fully set forth in the embodiment shown in FIGURE 3 piezoelectric ceramics such as barium titanate and lead titanate-zirconate can be used in place of the metallic magnetostrictive transducers of the type heretofore mentioned.

A coupler bar 16 of metal, such as stainless steel, is joined in axial end-to-end contact with magnetostrictive transducer 10. The end-to-end contact may be achieved by brazing, soldering, or the like.

The end of coupler bar 16 remote from magnetostrictive transducer 10 is provided with a plurality of sockets 18.

A plurality of wires designated by the numeral 20 are secured to coupler bar 16 with the uppermost tip portion of each wire brazed, welded or soldered within one of the sockets 18. The wires 20 may be of stainless steel or other metal. The wires 20 preferably have physical characteristics of flexibility permitting them to be readily bent or curved by digital manipulation so that they may be inserted within desired work areas. Alternatively, the wires may be substantially rigid but bendable, so that they may be bent to a desired shape and will retain such shape after the bending has been effected.

For certain uses, particularly those involving the use of tool A applied to solid materials, such as the direct cutting of solid materials, the overall cumulative length of coupler bar 16 and any one of the wires 20 preferably may be approximately equal to an even number of one-quarter wavelengths according to the properties of the metal forming coupler bar 16 and wires 20 at its applied frequency of operation. It is, of course, not necessary in this embodiment that each of the wires 20 be of the same length, although they may be, as long at the overall cumulative length of coupler bar 16 and anyone of wires 20 equals approximately an even number of one-quarter wavelengths. Also where the wires are used to produce standing waves, as in liquids having a substantially different acoustic impedance value from the wires 20, it may prove advantageous to dimension the overall cumulative length of the coupler bar 16 and the wires 20 to about an even number of one-quarter wavelengths, as aforesaid. Where the tool A is used for the treatment of liquid metals, such as molten solders, the dimensioning as to length is relatively unimportant.

In one embodiment of the tool A the coupler bar 16 was a cylindrical stainless steel bar having a one inch diameter. Ten wires were brazed to the end of the coupler bar, each wire constituting a cylindrical stainless steel wire having a one-tenth inch diameter. The wires 20 were relatively soft and flexible permitting the operator of the tool A to secure access to adjacent but separate work areas, with but a single magnetostrictive transducer being used for ten separate projects.

The embodiment of the present invention shown in FIGURE 3 comprises an ultrasonic soldering device designated B. A barium titanate ceramic 22 is utilized as the source of vibratory energy. As it is well known in the art, the barium titanate ceramic 22 is provided with a pair of silver plates (not shown) and a pair of lead wires (not shown) connected to the plates. The barium titanate ceramic 22 is provided with a backup mass 24 of metal. The use of the backup mass 24 of a metal having good thermal conductivity properties enables the ceramic element 22 to operate efficiently at its design frequency and facilitates heat dissipation therefrom. In place of barium titanate ceramic, other piezoelectric elements may be utilized.

The barium titanate ceramic 22 is joined to coupler bar 26 which consists of a solid cylindrical element of stainless steel or the like. While coupler bar 26 is shown as a solid cylindrical element, it is to be understood that a variety of shapes may be used therefor. Thus, coupler bar 26 may comprise a tapered member having a decreasing cross-sectional width from top to bottom. Alternatively, coupler bar 26 may comprise a tapered member which carries a cylindrical member, as in the embodiment shown in FIGURE 4. In yet another embodiment, the coupler bar 26 may be an exponentially curved horn which conforms to the equation set forth at page 163 in Piezoelectric Crystals and Ultrasonics, by Warren P. Mason, published in 1950 by Van Nostrand Company:

$$S=S_0e^{-2Tl}$$

where S is the original area, $S_0$ is the reduced area, T is a constant for the taper, and $l$ is the length of the tapered section.

Cylindrical coupler bar 26 is provided on its lowermost end with a plurality of drilled sockets 44 within which wires 46 are brazed or welded. Two wires 46 are shown in the drawings, but a different number of wires 46 may be used.

The wavelength of ultrasonic acoustical energy varies with the medium and the frequency of the alternating current. As the medium or the frequency of the alternating current is changed, the wavelength changes. Therefore, when dealing with ultrasonic acoustical energy it is more convenient to refer to the dimensions of an element in terms of wavelengths based on the medium from which the element is made instead of linear measures such as inches.

Each of wires 46 may be provided with a separate so-called Elmore mount comprising a concentric cylindrical shell 48 having a length equal to at least a single half wavelength according to the metal used for the shell at the applied frequency. The shell 48 may have a length of but a single one-half wavelength or may have a length of a plurality of one-half wavelengths. The Elmore mount is described in United States Letters Patent 2,891,180 in the name of William C. Elmore, entitled "Vibratory Device." Shell 48 is rigidly secured at one end 50 to the wire 46, with its other end 52 being free. An annular flange 54 is provided midway between the ends 50 and 52 of shell 48 when the shell is but a single one-half wavelength, flange 54 being received within a metal jig block 56. The lowermost end 58 of each of wires 46 may be suspended within a heated solder pot 60 containing molten solder. The wires 46 may be withdrawn from the pot 60 and manipulated by the user to effect soldering.

In place of solder pot 60, the solder may be disposed in a so-called preform state, or in wire, or other forms. Thus, in some embodiments of the present invention, it is not necessary that the solder be disposed in its molten condition, but the solder may be melted by contact with wires 46, which wires 46 may be heated as in the manner set forth below.

The wires 46 may be kept at an elevated temperature, preventing the wires 46 from acting as cold spots within the solder pot 60 by a variety of means. One method for accomplishing this is by connecting the jig block 56 to a source of current 62, as for example one pole of a battery, and also connecting the source of current 62 to the solder pot 60. A switch 64 is inserted in the line 66 intermediate solder pot 60 and source of current 62. The switch 64 should be closed after the lowermost end 58 of each of the wires 46 is inserted within the solder in solder pot 60, and should be opened just prior to the removal of the wires 46 from the solder within solder pot 60. The opening of the switch 64 prior to the removal of wires 46 prevents arcing between the solder contained within solder pot 60 and the lowermost end 58 of the wires 46. When the switch 64 is closed, a complete circuit is established running through line 66, solder pot 60, each of the wires 46, each of the flanges 54 and Elmore mounts 48 and jig block 56. As the wires 46 will be heated by this arrangement, cooling of the solder on the wires 46 will be prevented and interference due to cooling will be avoided.

Other methods for heating wires 46 may be substituted for the above method. Thus, wires 46 may be heated by means of a surrounding gas torch or resistance heater.

Figure 4:
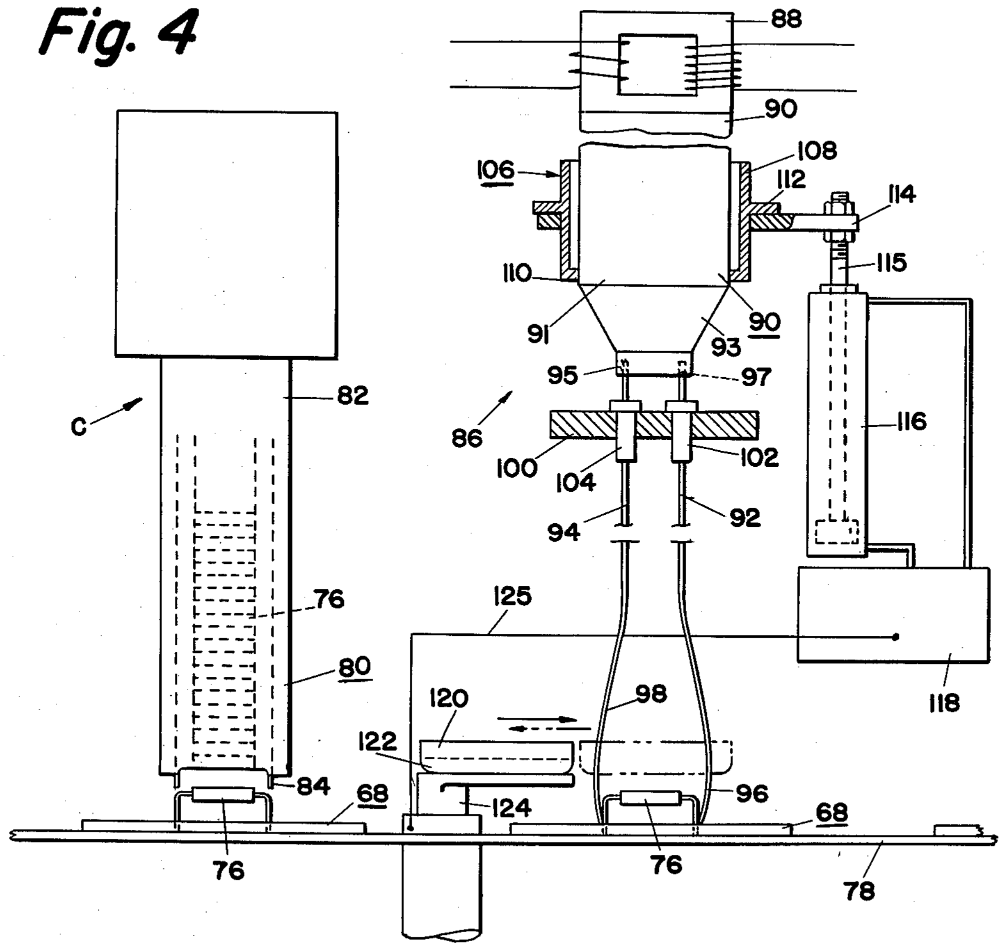
FIGURE 4 is a fragmentary view of the automatic printed circuit base plate assembly mechanism of the present invention.
Figure 5:
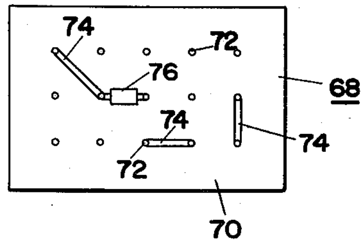
FIGURE 5 is a plan view of a printed circuit base plate having an electronic component element mounted thereon.

In the embodiment of the present invention shown in FIGURE 4 there is presented an automatic assembly mechanism for mounting component electronic elements upon a printed circuit base plate. The printed circuit base plate 68 consists of a perforated board of insulation material 70 having a plurality of openings 72. The openings 72 may be bushed as with tubular metal ferrules. Selected openings 72 may be joined by metal conductors 74 printed upon the base plate 68 prior to the adding of any of the electronic component elements, such as tubular capacitor 76, thereto. The metal conductors 74 may be mounted on one or both sides of the base plate 68 and form an electrical connection between the bushed openings 72 to which they are joined.

In the automatic assembly mechanism C of the present invention a plurality of base plates 68 are carried on conveyor web 78, and may be supplied thereto by a conventional automatic feeder mechanism which forms no part of the present invention and need not be illustrated herein. Such conventional automatic feeder mechanisms are utilized, for example, in the Autofab automatic assembly mechanism for electronic circuits manufactured by General Mills, Inc., 1620 Central Avenue, Minneapolis, Minnesota.

The base plate 68 is conveyed on conveyor web 78 to a positioning head 80 comprising a magazine designated generally by the numeral 82 and basal fingers 84. A plurality of component elements such as tubular capacitors 76 are positioned one above each other within magazine 82. The capacitors 76 are fed to base plate 68 through fingers 84, the conveyor web 78 being stopped in aligned disposition in respect to positioning head 80. The detailed construction of positioning head 80, magazine 82, basal fingers 84 and the stop means for controlling the movement of conveyor web 78 is not shown herein and forms no part of the present invention. A wide variety of conventional positioning heads, conveyor means, stop means and control means may be utilized in the mechanism of the present invention, as for example the magazine means, positioning means, and stop means contained in the various automatic assembly mechanisms sold by General Mills, Inc. under the trademark Autofab. The diagrammatic illustration of the positioning head 80 and the conveyor web 78 is sufficient for the purposes of the present invention to illustrate the type of means herecontemplated, and will apprise anyone skilled in this art as to the type of means intended.

The positioning head 80 locates the capacitor 76 within desired openings 72 in the printed circuit base plate 68. This is accomplished by the positioning head 80 moving downward when the printed circuit base plate 68 is positioned therebeneath, releasing a capacitor 76 into the desired openings 72, and then moving upward. After positioning head 80 has moved upward the conveyor web 78 is advanced again. Preferably, the upward movement of positioning head 80 and the subsequent advance of conveyor web 78 is controlled by the movement of a single cam (not shown) permitting positive coordination between these members. Such form of control means is the one conventionally adopted for this form of assembly mechanism, and is used on the General Mills devices referred to above. The printed circuit base plate 68 is advanced from beneath positioning head 80 to a position beneath soldering unit 86, at which time the forward motion of conveyor web 78 is stopped. Preferably, the stopping of conveyor web 78 should be effected in such a manner that not only is a base plate 68 containing a capacitor 76 carried within openings 72 positioned beneath soldering unit 86, but moreover, a base plate 68 lacking a capacitor 76 is simultaneously positioned beneath positioning head 80. In this manner, soldering unit 86 may operate upon a printed circuit base plate 68 which was just operated upon by positioning head 80, while simultaneously positioning head 80 may deposit a capacitor 76 within a newly positioned base plate 68.

Soldering unit 86 includes a magnetostrictive transducer 88 (which may be similar to the magnetostrictive transducer 10 utilized in tool A, illustrated in FIGURES 1 and 2), brazed in end-to-end contact to a coupler bar 90 which includes an upper cylindrical portion 91, an intermediate tapered portion 93, and a bottom cylindrical portion 95. Alternatively, coupler bar 90 may resemble coupler bar 16 shown in tool A. A pair of wires 92 and 94 depend from coupler bar 90, the wires 92 and 94 being brazed or welded within sockets 97 carried in the lower end portion of coupler bar 90. The wires 92 and 94 are of such thickness and rigidity that they may be permanently bent as at their lowermost ends or tips 96 and 98 respectively, and though possessing a certain amount of flexibility will retain their arcuate bends through use. A jig 100 having a pair of guidesleeves 102 and 104 may be used to guide the wires 92 and 94. In some embodiments, it is possible to work with relatively short tapered wires which possess a relatively high degree of rigidity, and to thereby dispense with the use of jig 100.

An Elmore mount 106 consisting of a sleeve 108 having an axial length equal to a single one-half wavelength at the applied frequency is secured at its lowermost end 110 to coupler bar 90. An annular flange 112 from sleeve 108 is joined to a plate 114, which is carried upon the piston rod 115 of a hydraulic cylinder 116 which may be used to raise or lower wires 92 and 94 responsive to an electrical control mechanism 118 which is responsive to the movement of conveyor web 78. A solder pot 120 provided with its basal internal heater 122 is carried on reciprocally movable member 124, which is connected and responsive to control mechanism 118 by wire 125.

The operation of the soldering unit portion of the apparatus shown in FIGURE 4 is as follows:

A printed circuit base plate 68 is moved by conveyor web 78 to beneath soldering unit 86. During the transmission of base plate 68 to beneath soldering unit 86 the unit 86 is in its elevated position. In this position, the bent tips 96 and 98 of wires 92 and 94 are immersed in molten solder within solder pot 120, which is disposed in the position shown in phantom line in FIGURE 4. The elevation and depression of soldering unit 86 is effected by means of hydraulic cylinder 116, which responds to control mechanism 118. When control mechanism 118 senses that base plate 68 is beneath soldering unit 86, as by conventional indicating means carried on conveyor web 78, which forms no part of the present invention, the wires 92 and 94 are raised from the solder pot 120, the cylinder 116 raising the entire soldering unit, and the solder pot 120 is displaced laterally and is carried out of the axial plane of soldering unit 86 by member 124 to its position shown in solid line. The solder pot 120 may be mounted on means permitting it to be raised and lowered facilitating the insertion therein and removal therefrom of wires 92 and 94. Cylinder 116 then lowers soldering unit 86 to its depressed position, wherein the wires 92 and 94 are operatively disposed adjacent the leads of capacitor 76 and the mating bushed openings 72 therefor. Wires 92 and 94 retain a sufficient amount of solder carried over from solder pot 120 on their tips 96 and 98 to effect the soldering operation. Energizing current is then applied to magnetostrictive transducer 88 and elastic vibratory energy is applied through wires 92 and 94 to the solder carried on wire tips 96 and 98 effecting soldering of the leads from the capacitor 76 to the metal openings 72. The use of flux for ultrasonic soldering is unnecessary.

When the soldering has been completed, a matter requiring but a very short time interval, the control mechanism 118 directs cylinder 116 to effect the raising of soldering unit 86 to a position above the position in which the wire tips 96 and 98 are received in solder pot 120. The solder pot 120 is then moved laterally to the position shown in phantom line, following which the unit 86 is again lowered, so that the ends 96 and 98 of wires 92 and 94 become immersed in soldering pot 120 and again become coated with molten solder. When soldering unit 86 is raised the control mechanism again advances conveyor web 78.

The aforesaid sequential operation may be performed at a relatively rapid production rate, as for example a production rate of 20 assembled printed circuit base plates per minute.

A plurality of positioning heads and a like number of adjacent soldering units may be provided within a single automatic assembly mechanism, with the conveyor web 78 coordinated so that each of the positioning heads and soldering units is operating at the same instant. Under this arrangement a variety of components may be mounted onto a printed circuit base plate permitting an entire assembly to be made.

While the ultrasonic tools of the present invention have been described primarily for application to ultrasonic soldering of printed circuitry, it is, of course, to be understood that this invention is not to be so-limited, but that the ultrasonic tools dissolved herein may be employed for a wide variety of purposes wherein the application of ultrasonic energy is feasible, including as by way of example: the preparation of automation devices, instrument assemblies, electronic sub-assemblies, chassis assemblies, modular circuitry, prong base tip connections, transistor connections, commutator connections and also the emulsification of liquids, the precipitation of solids from solutions and colloidal precipitates from colloidal solutions, the sterilization and cleaning of liquids and other materials, the direct cutting of solids, etc.

The present invention may be embodied in other specific forms without departing from the spirit or essential attributes thereof and, accordingly, reference should be made to the appended claims, rather than to the foregoing specification as indicating the scope of the invention.

I claim:

1. An ultrasonic tool for delivering axial vibration, said tool including transducer means for producing elastic vibratory energy, a coupler bar securedly axially joined to said transducer means, a plurality of vibration transmitting members securedly axially joined to said coupler bar, each of said vibration transmitting members having a relatively small cross-sectional width compared to the cross-sectional width of the portion of the coupler bar with which it is engaged, and a support mount for supporting said tool comprising a resonant member at least a single one-half wavelength long according to the properties of its material and the frequency of operation, said support mount spaced from and embracing said coupler bar and having one end attached to said coupler bar, the other end being free from attachment to establish a node when said transducer means is operating for anchoring the support mount to a support means.

2. An ultrasonic tool for delivering axial vibration, said tool including transducer means for producing elastic vibratory energy, a coupler bar securedly axially joined to said transducer means, a plurality of vibration transmitting members securedly axially joined to said coupler bar, each of said vibration transmitting members having a relatively small cross-sectional width compared to the cross-sectional width of the portion of the coupler bar with which it is engaged, and means for heating said vibration transmitting members.

3. An ultrasonic soldering assembly comprising transducer means for producing elastic vibratory energy, a coupler bar securedly axially joined to said transducer means, a plurality of wires securedly axially joined to said coupler bar, each of said wires being relatively flexible and having a relatively small cross-sectional width when compared to the coupler bar, a support mount for each wire comprising a resonant member at least a single one-half wave length long according to the properties of the material and the frequency of operation, said resonant member spaced from and embracing its companion wire and having one end attached to said wire, the other end of said resonant member being free from attachment, a solder pot, a source of electrical energy, and electrical conductors from said source of electrical energy connected to said solder pot and to said support mount.

4. An ultrasonic tool for delivering axial vibration, said tool including transducer means for producing elastic vibratory energy, an elongated coupler bar securedly axially joined to said transducer means, a plurality of elongated discrete vibration transmitting members securedly axially joined to said coupler bar, each of said vibration transmitting members having a relatively small cross-sectional area throughout its length compared to the cross-sectional area of the portion of the coupler bar with which it is engaged, said coupler bar being rigid, each of said vibration transmitting members being flexible and having sufficient length so that it may be readily bent by digital manipulation.

5. A tool in accordance with claim 4 in which at least one of said members is provided with a support mount, said mount comprising a resonant member at least a single one-half wavelength long according to the properties of its material and the frequency of operation, said support mount being spaced from and embracing a portion of said one flexible member and having one end attached to said one flexible member, the other end of said resonant member being free from attachment to establish a node when said transducer means is operating for anchoring the support mount to a support means.

6. A tool in accordance with claim 4 in which the cumulative length of the coupler bar and each of the vibration transmitting members is approximately equal to an even number of one-quarter wavelengths at the applied frequency.

7. A tool in accordance with claim 4 in which the transducer means for producing elastic vibratory energy constitutes a magnetostrictive transducer which is joined in end-to-end engagement with the coupler bar.

8. A tool in accordance with claim 7 in which the elongated coupler bar comprises an elongated solid coupler bar having at the end which is opposite to the magnetostrictive transducer, a plurality of socket extending axially, with each of the vibration transmitting members being securedly seated within one of said sockets and extending axially therefrom.

9. A tool in accordance with claim 4 in which each of the vibration transmitting members has a length greater than the length of the coupler bar.

10. A tool in accordance with claim 4 in which each of the vibration transmitting members is an elongated rod member of uniform cross-section throughout its length, with its end remote from the coupler bar being free.

11. An automatic assembly mechanism for producing electronic circuits from printed circuit base plates comprising a conveyor web on which the printed circuit base plates are carried, means adjacent said conveyor web for depositing an electronic component onto the printed circuit base plates, and an ultrasonic soldering unit adjacent said conveyor web for joining the leads from said electronic component to the printed circuit base plate, said ultrasonic soldering unit including transducer means for producing elastic vibratory energy, a coupling bar securedly axially joined to said transducer means, a pair of elongated soldering iron elements extending axially from the coupler bar and securedly joined thereto, means for moving the free ends of the soldering iron elements between a disposition in which they engage the leads of the electronic component on a printed circuit base plate on the conveyor web adjacent the ultrasonic soldering unit, and a disposition in which the free ends of the soldering iron elements are spaced from the leads of the electronic component on the printed circuit base plate, a soldering pot, means for supporting said soldering pot, means for moving said soldering pot between a position in which solder in said soldering pot is operatively engaged with the free ends of said soldering iron elements and a position in which said soldering pot is displaced therefrom, and synchronizing means for displacing the soldering pot from the free ends of the soldering iron elements when the free ends of the soldering iron elements operatively engage the leads of the electronic component on the printed circuit base plate and for moving said soldering pot into operative engagement with the free ends of said soldering iron elements when the free ends of said soldering iron elements are spaced from the leads of the electronic component on the printed circuit base plate.

12. An automatic assembly mechanism for producing electronic circuits from printed circuit base plates in accordance with claim 11 in which the elongated soldering iron elements comprise relatively thin and relatively flexible elements when compared with the width dimension and flexibility of the coupling bar.

References Cited in the file of this patent

UNITED STATES PATENTS

| | | |
|---|---|---|
| 399,387 | Dolan | Mar. 12, 1889 |
| 1,269,617 | Ledwinka | June 18, 1918 |
| 2,222,906 | Hentzen | Nov. 26, 1940 |
| 2,397,400 | Barwich | Mar. 26, 1946 |
| 2,429,888 | Moore | Oct. 28, 1947 |
| 2,452,211 | Rosenthal | Oct. 26, 1948 |
| 2,580,716 | Balamuth | Jan. 1, 1952 |
| 2,616,223 | Jonker | Nov. 4, 1952 |
| 2,676,236 | Birkbeck et al. | Apr. 20, 1954 |
| 2,704,333 | Calosi et al. | Mar. 15, 1955 |
| 2,715,079 | Rhodes | Aug. 9, 1955 |
| 2,792,674 | Balamuth et al. | May 21, 1957 |
| 2,825,186 | Palush | Mar. 4, 1958 |
| 2,866,069 | Kriwaczek | Dec. 23, 1958 |
| 2,891,180 | Elmore | June 16, 1959 |

FOREIGN PATENTS

| | | |
|---|---|---|
| 719,386 | Great Britain | Dec. 1, 1954 |

OTHER REFERENCES

"Segic Electric Soldering Gun," Electric Engineering, March 1950, page 119. Copy in Div. 37—219–26.1.